United States Patent [19]

Yeom

[11] Patent Number: 4,816,612

[45] Date of Patent: Mar. 28, 1989

[54] SHIELD CASE FOR ANTENNA TERMINAL

[75] Inventor: Kwang Y. Yeom, Kyungsangbook, Rep. of Korea

[73] Assignee: Goldstar Co., Ltd., Seoul, Rep. of Korea

[21] Appl. No.: 105,584

[22] Filed: Oct. 8, 1987

[30] Foreign Application Priority Data

Oct. 8, 1986 [KR] Rep. of Korea ............... 15371/1986

[51] Int. Cl.$^4$ .............................................. H05K 9/00
[52] U.S. Cl. .................................. 174/35 R; 174/52.1
[58] Field of Search .......................... 174/35 R, 52 R; 361/424

[56] References Cited

U.S. PATENT DOCUMENTS 3,524,137  8/1970  Redfield et al. ............... 361/424 X
4,152,671  5/1979  Tuma et al. ................... 174/35 R X

FOREIGN PATENT DOCUMENTS 2156162  10/1985  United Kingdom ............... 361/424

Primary Examiner—A. T. Grimley
Assistant Examiner—David A. Tone
Attorney, Agent, or Firm—Birch, Stewart, Kolasch & Birch

[57] ABSTRACT

A shield case for an antenna terminal having a substrate housed therewithin. The substrate contains signal-transmitting condensers and ground-balancing condensers which are spaced from one another and, gaps which are provided between each of the signal-transmitting condensers and between each of the ground-balancing condensers which serve to exhibit excellent insulation and resist pressure. The substrate further has holes for receiving leads of the condensers wherein the condensers are connected in series to a central conductor and shields the wire of the coaxial cable.

1 Claim, 4 Drawing Sheets

SHIELD CASE FOR ANTENNA TERMINAL

FIELD OF THE INVENTION

The present invention relates to a shield case for a 75Ω TV antenna terminal for use to prevent the generation interference from the outside.

BACKGROUND OF THE INVENTION

There are many types of conventional shield cases for an antenna terminal. For example, the shield case disclosed in Korean Utility Model Application No. 4678/1984 (Publication No. 1127/1986) comprises two halves in which corresponding two halves of an inner case are housed. The lower half of the inner case has a separator member formed therein whereby a signal-transmitting condenser and a ground-balancing condenser are separately located. The condensers are connected to input and output connectors.

This conventional shield case has certain disadvantages in that a working process such as connections of condensers to connectors is not simple, the quality of the finished product is not uniform, and it is cumbersome to manufacture special inner case.

SUMMARY OF THE INVENTION

Accordingly it is an object of the present invention to provide a shield case which contains a substrate having components such as condensers, the shield case being easy to assemble.

Another object of the present invention is to provide a shield case having simple construction which requires no special inner case and a separator member.

The shield case according to the present invention comprises a substrate at which signal-transmitting condensers are provided with spaces from ground-balancing condensers, gaps being made between the two signal-transmitting condensers and between the two ground-balancing condensers to such an extent that no interference therebetween is generated; a case in which the substrate is housed; and a cap which slidingly engages with engage the case.

BRIEF DESCRIPTION OF THE DRAWINGS

These and other objects, features, and advantages of the present invention will become apparent from the following description when taken in conjunction with the accompanying drawings wherein like characters of reference designate corresponding parts throughout the views and, wherein.

DETAILED DESCRIPTION OF THE INVENTION

Figure 1:
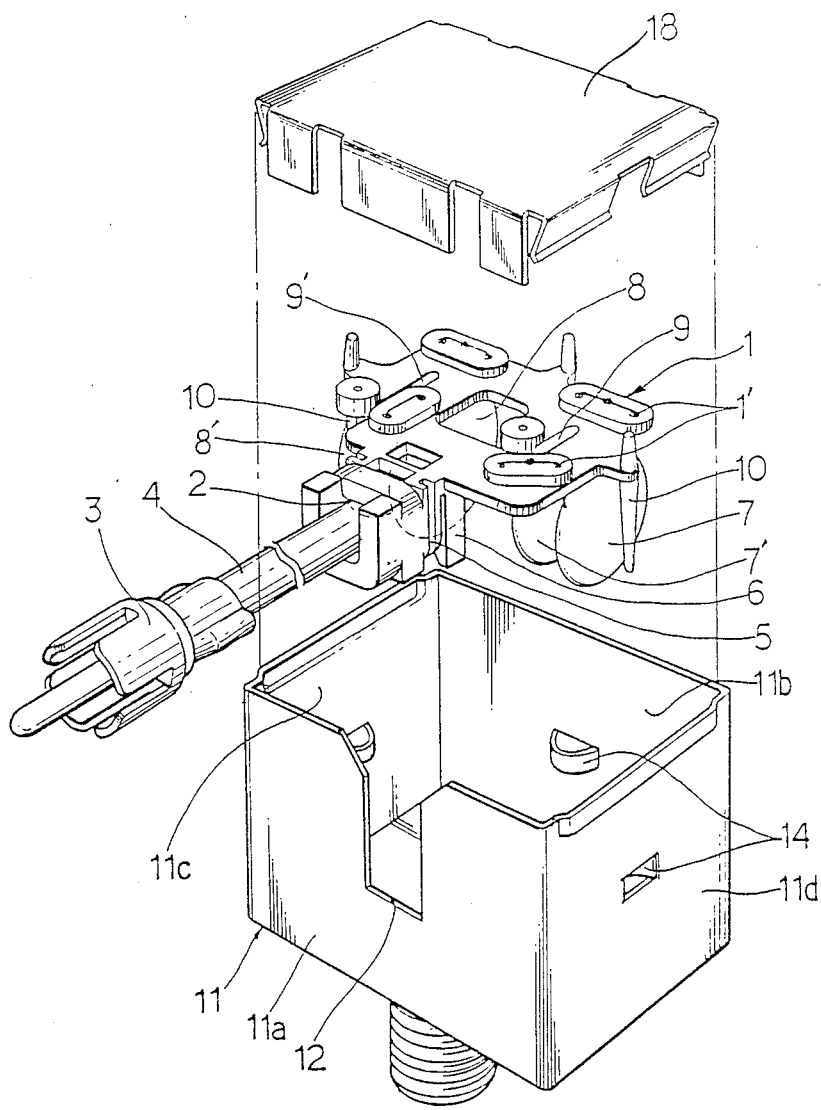
FIG. 1 is an exploded perspective view showing the shield case according to the present invention.
Figure 2:
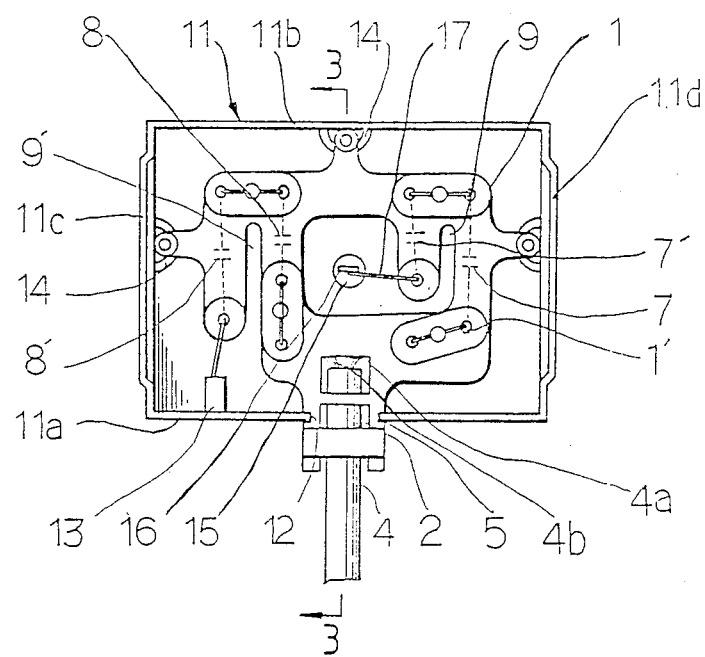
FIG. 2 is a plan view of the assembly of the shield case of the present invention with the cap removed from the case.
Figure 3:
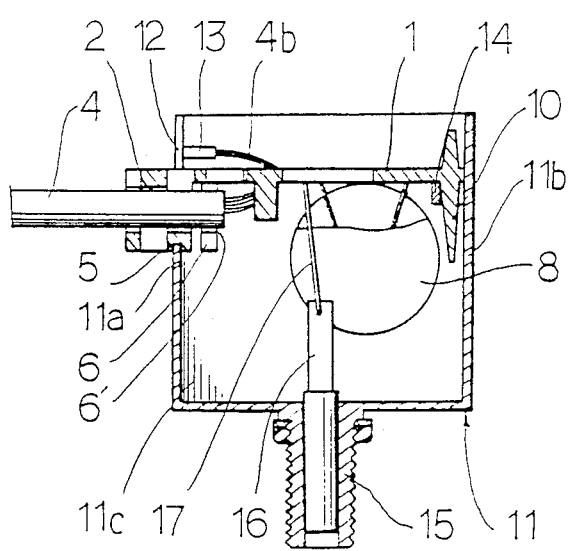
FIG. 3 is a cross-sectional view of FIG. 2, taken along line 1–3.

Referring to FIGS. 1 through 3, a plastic substrate 1 of a predetermined size housed within a case body 11 has an integrally molded protruding member. The protruding member of plastic includes an inner hole 2 for receiving a coaxial cable 4 connected to an output connector 3. A groove 5 is formed at the exterial periphery of the protruding member, with the top portion of the protruding member not being grooved. Behind the groove 5 are provided a pair of resilient tong-shaped support members 6 for fittingly fixing the coaxial cable 4 therebetween. The support members 6 have a respective hook 6' at their end portion and stand opposite to each other.

On the substrate 1 are provided integrally molded oval plastic bases spaced from one another. The holes 1' are formed through the oval plastic bases and the substrate 1 for receiving leads of signal-transmitting condensers 7,7' and ground-balancing condensers 8, 8' which are provided beneath the substrate 1. Gaps 9, 9' are made between the condensers 7, 7' and between the condensers 8, 8' whereby the insulation and resistance to pressure is well achieved.

At the both side ends and the back end of the substrate 1, there are formed integrally molded downwardly pointed rods 10.

The elongated case body 11 housing the substrate 1 includes of an opening groove 12 at the front wall 11a for engaging the groove 5 of the substrate 1. The front wall 11a has an integrally ground plate 13 formed thereon.

The side walls 11c, 11d and the back wall 11b of the case body 11 have laterally protruding member 14, each of which has a hole into which the pointed rods 10 are to be inserted. An input connector 15 having a terminal 16 is laterally positioned at the bottom of the case body 11.

In an assembly of a preferred embodiment, first, the coaxial cable 4 is received into the hole 2 and fittingly fixed between the resilient tong-shaped support members 6.

Figure 4:
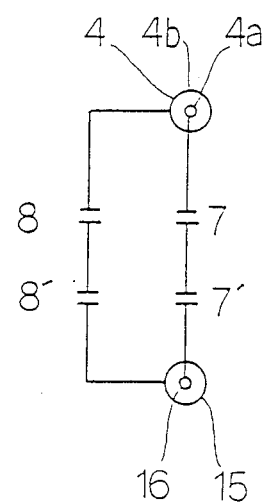
FIG. 4 is a circuit diagram of the shield case shown in FIGS. 1 through 3.

The condensers 7, 7A',8 and 8' are connected in series to the central conductor 4a and the shield wire 4b of the coaxial cable 4. That is to say, as clearly shown in FIG. 4, the central conductor 4a is passed through one of the holes 1' and connected, by soldering on one of the oval plastic base, to the one lead of the condenser 7. The other lead of the condenser 7 is passed through one of the holes 1' and connected, by soldering on one of the oval plastic base, to the one lead of the condenser 7'. The other lead of the condenser 7' is connected to the terminal 16 of the input connector 15 through a connecting wire 17.

The shield wire 4b is passed through one of the holes 1' and connected, by soldering on one of the bases, to the one lead of the condenser 8. The other lead of the condenser 8 is passed through one of the holes 1' and connected, by soldering on one of the bases, to the one lead of the condenser 8'. The other lead of the condenser 8' is connected to the ground plate 13 of the case body 11.

The substrate 1 then is housed in the case 11, with the downwardly projecting pointed rods 10 being inserted into the holes of the laterally protruding members 14 and the groove 5 being engages the open groove 12.

Upon fitting slidingly the cap 18 to the case body 11 the assembly is complete.

When the signal received through the 75Ω antenna is input into the input connector 15, only the alternating-current of the signal is put into a television tuner through the coaxial cable 4 and the output connector 3 because the condensers 7,7', 8 and 8' block the flow of direct current, and permit the flow of alternating current. The shield case 11 with a cap 18 serves to block the outer jamming radio waves, preventing a beat in the picture.

A shield case constructed in accordance with the present invention has an excellent effect of insulation and resisting pressure because of uniform space between the condensers 7, 7' 8 and 8', and the gaps 9, 9'.

Figure 5:
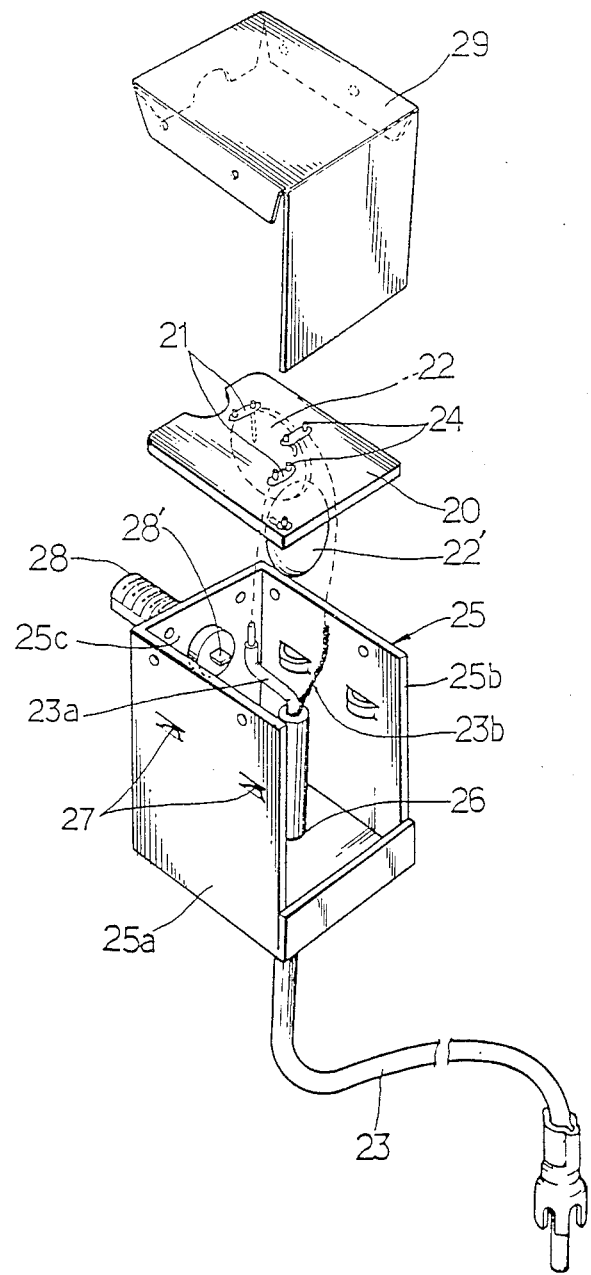
FIG. 5 is an exploded perspective view of the shield case but showing another embodiment of the present invention.
Figure 6:
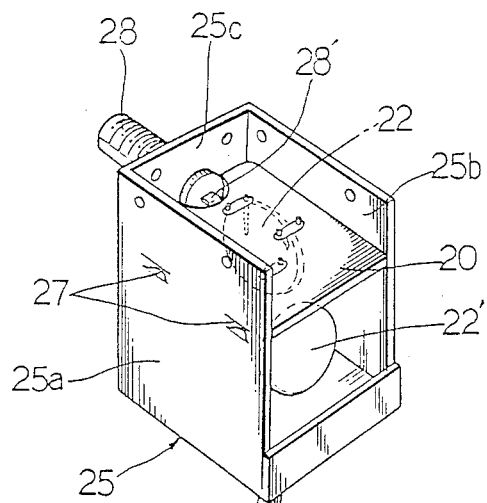
FIG. 6 is a perspective view showing the assembly of a shield case in FIG. 5 with the cap removed from the case.
Figure 7:
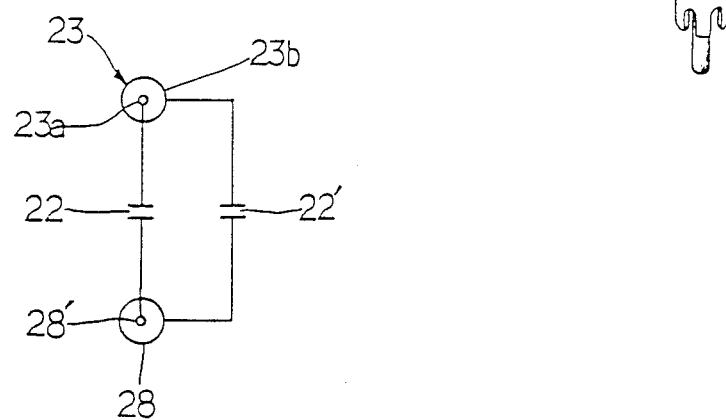
FIG. 7 is a circuit diagram of a shield case of another embodiment of the present invention.

Referring now to FIGS. 5 through 7, another embodiment of the present invention includes a Printed Circuit Board 20 having plates 21 plated with copper. Each of the plates 21 has holes 24 into which the leads of a signal-transmitting condenser 22, a ground-balancing condenser 22+, and a central conductor 23a and the shield wire 23b are inserted. A shield case 25 has a hole 26 at a bottom thereof through which a coaxial cable 23 is passed, and laterally protruding support members 27 are formed at both side walls 25a, 25b thereof onto which the Printed Circuit Board 20 is to be laid. An integrally molded input connector 28 is fixed to the back wall 25c of the case 25.

In assembling, as clearly shown in FIG. 7, the central conductor 23a is passed through one of the holes 24 and soldered in place. The one lead of the condenser 22 is passed through one of the holes 24 and soldered in place for being connected to the central conductor 23a. The other lead of the condenser 22 is connected to a terminal 28'.

The shield wire 23b is connected to the condenser 22' by soldering. The condenser 22' is connected to the input connector 28.

The Printed Circuit Board 20 is then laid onto the laterally protruding support members 27.

Upon fitting slidingly a cap 29 to the case 25 the assembly is complete.

The shield case shown in FIGS. 5, 6 constructed according to another embodiment of the present invention has the same operation and effect as that of the shield case shown in FIG. 1.

Alternatively, the Printed Circuit Board 20 can be slidingly and laterally fitted to the case 25a by providing more support members other than the support members 27.

What is claimed is:

1. A shield case for an antenna terminal comprising:
   a plastic substrate which includes,
   a forwardly protruding member extending from said plastic substrate, said protruding member having a hole for receiving a coaxial cable having an output connector connected thereto, and having an externally peripheral groove,
   a pair of resilient tong-shaped support members formed behind said groove for fittingly fixing said coaxial cable therebetween,
   lead holes for receiving leads of signal-transmitting condensers and ground-balancing condensers,
   insulation gaps between said signal-transmitting condensers and said ground-balancing condensers, and
   downwardly protruding pointed rods disposed at both side ends and back end of said substrate; and
   a case for housing said substrate, said case having an open groove at front wall thereof for engaging said forwardly protruding member, and including,
   a ground plate formed at the inner front wall thereof,
   protruding members having holes for receiving said downwardly protruding pointed rods, and being formed at the back wall and both side walls of said case, and
   a cap for slidably engaging with said case, whereby the shield case prevents the generation of interference from the outside.

* * * * *